United States Patent
Liu et al.

(10) Patent No.: US 7,368,806 B2
(45) Date of Patent: May 6, 2008

(54) FLIP CHIP PACKAGE WITH ANTI-FLOATING STRUCTURE

(75) Inventors: Chien Liu, Kaoshiung (TW); Meng-Jen Wang, Kaoshiung (TW); Sheng-Tai Tsai, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 95 days.

(21) Appl. No.: 11/296,489

(22) Filed: Dec. 8, 2005

(65) Prior Publication Data

US 2006/0125113 A1    Jun. 15, 2006

(30) Foreign Application Priority Data

Dec. 14, 2004    (TW) .............................. 93138765 A

(51) Int. Cl.
*H01L 23/495*    (2006.01)
*H01L 23/48*    (2006.01)

(52) U.S. Cl. .................. 257/676; 257/778; 257/773; 257/774; 257/E23.033; 257/E23.039; 438/123

(58) Field of Classification Search ............... 257/778, 257/E23.033, E23.039, 727, 676, 666, 735, 257/692, 697, 773, 774, 786
See application file for complete search history.

(56) References Cited

U.S. PATENT DOCUMENTS 4,787,853 A * 11/1988 Igarashi ..................... 439/55
5,214,308 A * 5/1993 Nishiguchi et al. ......... 257/692
6,194,781 B1 * 2/2001 Ikegami ..................... 257/737
6,388,336 B1 * 5/2002 Venkateshwaran et al. . 257/779
6,815,833 B2   11/2004 Lee et al.
6,815,883 B2 * 11/2004 Chow et al. ................. 313/493
2002/0079592 A1 * 6/2002 Lo et al. ..................... 257/778
2002/0084534 A1 * 7/2002 Paek .......................... 257/778
2003/0173684 A1 * 9/2003 Joshi et al. .................. 257/783
2006/0170081 A1 * 8/2006 Gerber et al. ............... 257/666

FOREIGN PATENT DOCUMENTS

TW          5675998        12/2003

* cited by examiner

*Primary Examiner*—Theresa T. Doan
*Assistant Examiner*—Sarah K Salerno
(74) *Attorney, Agent, or Firm*—Volentine & Whitt, P.L.L.C.

(57) ABSTRACT

A flip chip package with an anti-floating structure includes a leadframe, a flip chip, and a plurality of solders. The leadframe includes a plurality of leads and a fastening part. At least one locking hole is formed on an upper surface of the fastening part. The flip chip includes an active surface, and at least one locking protrusion and a plurality of bumps formed on the active surface. The locking protrusion is correspondingly plugged into the locking hole to act as an anti-floating structure for the flip chip package. When the solders are used for connecting the bumps with the leads by reflowing, the anti-floating structure will prevent the flip chip from floating up, and the solders will not generate necking after reflowing.

8 Claims, 4 Drawing Sheets

FLIP CHIP PACKAGE WITH ANTI-FLOATING STRUCTURE

BACKGROUND OF THE INVENTION

1. Field of the Invention

The present invention relates to a flip chip package, and more particularly to a flip chip package with an anti-floating structure, which facilitates the solder to connect the bumps of a flip chip with a leadframe.

2. Description of the Related Art

In the recent development of packaging technique, the flip chip package has become the current focus. A conventional flip chip package is used to flip-chip bond a chip to a leadframe, so as to reduce the package cost. As disclosed in ROC Patent Publication No. 567598, entitled "Flip Chip Package of Semiconductor Chips", it comprises a leadframe, a semiconductor chip, a plurality of first bumps, and a plurality of second bumps. The leadframe comprises a die pad and a plurality of leads. The semiconductor chip comprises an active surface and a back surface opposite to the active surface on which a plurality of first solder pads and second solder pads are formed. The first bumps and the second bumps are disposed on the corresponding first solder pads and second solder pads respectively, so that the semiconductor chip becomes a flip chip. The semiconductor chip is arranged with the active surface facing the leadframe, and the first bumps and the second bumps are connected to the die pad and the leads, respectively. However, since the first bumps and the second bumps are low temperature eutectic bumps so as to be soldered to the leads, when they are soldered to the die pad and the leads, the leads of the leadframe do not have a solder mask to define the soldering area, and the heights of the first bumps and the second bumps will thus be affected by collapse and diffusion.

Referring to FIGS. 1 and 2, another conventional bonding method that is to bond the high-temperature bumps of a flip chip to a leadframe through the solder is disclosed. The conventional flip chip package 100 mainly comprises a leadframe 110, a flip chip 120, and a plurality of eutectic solders 130. The leadframe 110 comprises a plurality of leads 111 that comprise the eutectic solders 130 formed beforehand. The flip chip 120 comprises a plurality of high temperature bumps 121, e.g., high lead bumps, such as lead/tin 95/5, so that the high lead bumps 121 will not be melted during reflowing of the eutectic solders 130, thus avoiding the collapse and diffusion of the bumps 121. Referring to FIG. 2, the eutectic solders 130 are used for soldering the high temperature bumps 121 of the flip chip 120 to the leads 111 of the leadframe 110. During the process of reflowing, the flip chip 120 may always float up because of the surface tension of the eutectic solders 130, such that the solders 130 may form a necking portion 131 at one side near the leadframe 110 after reflowing. Therefore, the stress is easily concentrated on the necking portion 131, which may easily break off.

Consequently, there is an existing need for a flip chip package with an anti-floating structure to solve the above-mentioned problems.

SUMMARY OF THE INVENTION

An objective of the present invention is to provide a flip chip package with an anti-floating structure. A leadframe comprises a plurality of leads and a fastening part. The fastening part comprises at least one locking hole. A flip chip comprises a plurality of bumps and at least one locking protrusion. When the bumps of the flip chip are bonded with the leads of the leadframe through a plurality of solders, the locking protrusion is correspondingly plugged into the locking hole to act as anti-floating structure for the flip chip package. The anti-floating structure is used for fastening the flip chip to the leadframe, so as to prevent the flip chip from floating up when reflowing, and the solders will not generate necking after reflowing.

Another objective of the present invention is to provide a flip chip package with an anti-floating structure, wherein a bonding agent is applied into the locking hole to fasten the locking protrusion to the locking hole. Therefore when the solders are used to connect the bumps with the leads, the flip chip may be prevented from floating up, and the solders will not generate necking after reflowing. The flip chip package with an anti-floating structure according to the present invention comprises a leadframe, a flip chip, and a plurality of solders, wherein the leadframe comprises a plurality of leads and a fastening part. The fastening part comprises at least one locking hole. The flip chip comprises an active surface and at least one locking protrusion and a plurality of bumps formed on the active surface. The locking protrusion is plugged into the locking hole, and the solders are used for connecting the leads with the bumps.

DETAILED DESCRIPTION OF THE INVENTION

The present invention will be described in the following embodiments, with reference to the accompanying drawings.

Figure 1:
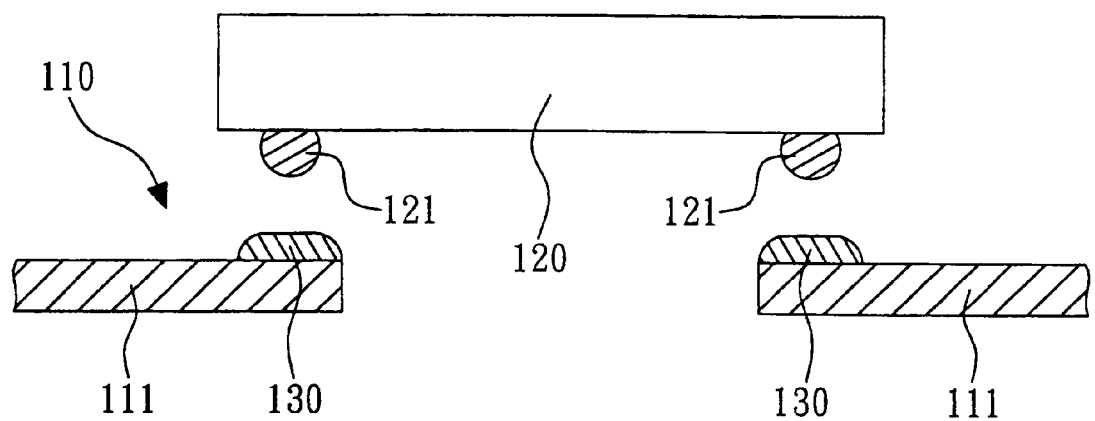
FIG. 1 is a schematic sectional view of a conventional flip chip package when being flip-chip bonded.
Figure 2:
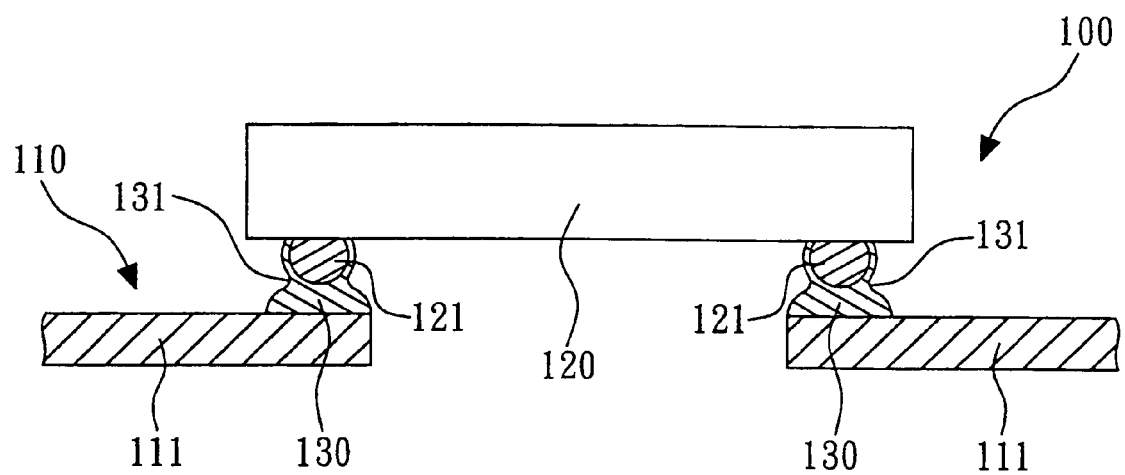
FIG. 2 is a schematic sectional view of a conventional flip chip package when generating necking of the solders after being flip-chip bonded.
Figure 3A:
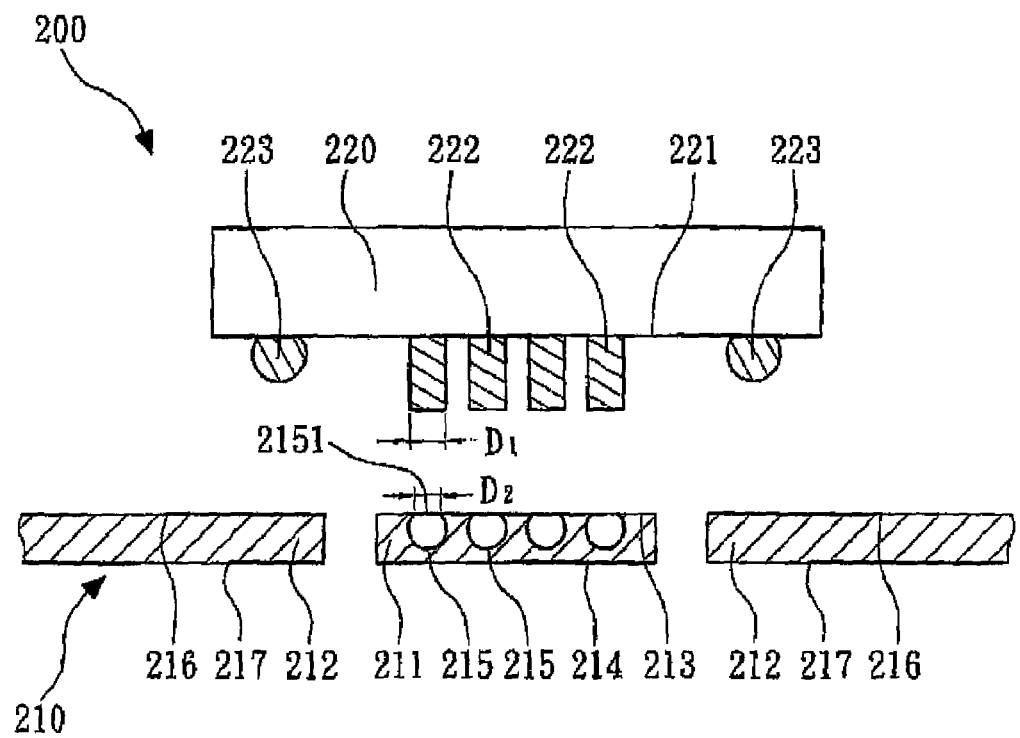
FIG. 3a is a schematic sectional view of a flip chip package with an anti-floating structure before being flip-chip bonded according to a first embodiment of the present invention.
Figure 3B:
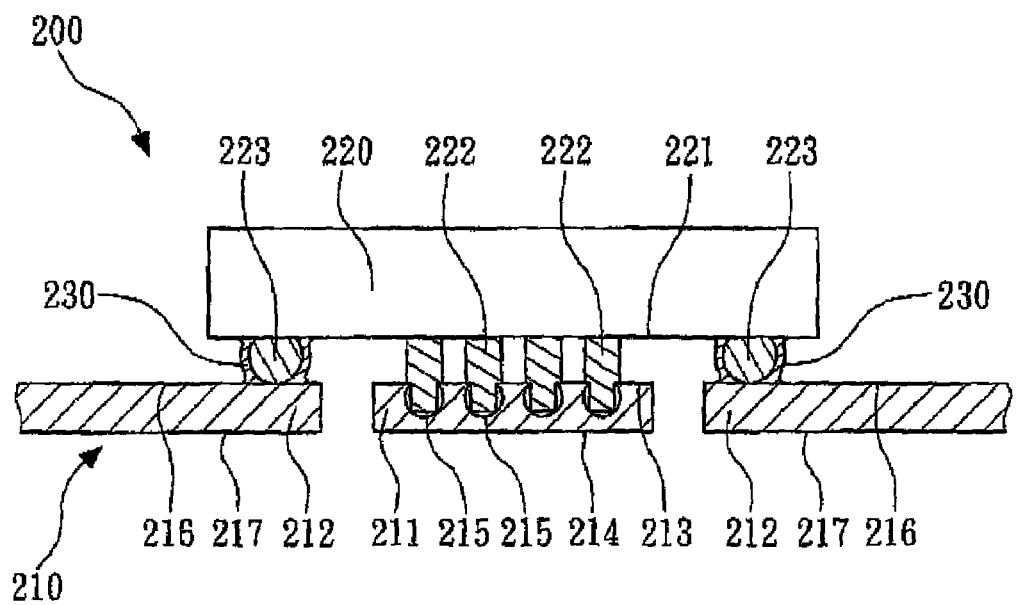
FIG. 3b is a schematic sectional view of a flip chip package with an anti-floating structure when being flip-chip bonded according to a first embodiment of the present invention.
Figure 4:
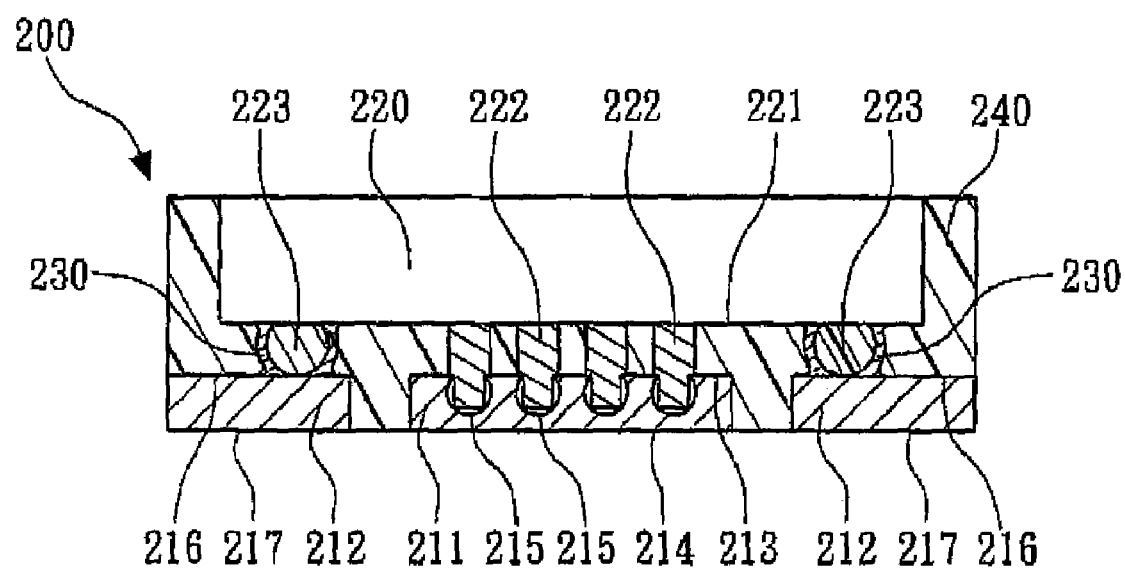
FIG. 4 is a schematic sectional view of a flip chip package with an anti-floating structure after being molded according to the first embodiment of the present invention.

Referring to FIGS. 3a, 3b and 4, according to a first embodiment of the present invention, a flip chip package 200 with an anti-floating structure comprises a leadframe 210, a flip chip 220, a plurality of solders 230, and a molding compound 240. The leadframe 210 comprises a fastening part 211 and a plurality of leads 212. The fastening part 211 has an upper surface 213 and a lower surface 214, and is smaller than the flip chip 220. The fastening part 211 may be rectangular plate shaped or strip shaped. The upper surface 213 of the fastening part 211 comprises at least one locking hole 215. Preferably, the fastening part 211 comprises a plurality of symmetrically distributed locking holes 215, which are formed by semi-etching process, and each of the locking holes 215 has an opening 2151 on the upper surface 213 of the fastening part 211. Each lead 212 comprises an upper surface 216 and a lower surface 217. The flip chip 220 comprises an active surface 221 and at least one locking protrusion 222. The locking protrusion 222 and a plurality of bumps 223 are formed on the active surface 221.

In this embodiment, the looking protrusion 222 is located at the center portion of the active surface 221, whereas the bumps 223 are located at the periphery of the active surface 221. The outside diameter $D_1$ of the locking protrusion 222 is slightly larger than the diameter $D_2$ of the opening 2151 of the locking hole 215 (FIG. 3a), so that the locking protrusion 222 is plugged into the locking hole 215 (FIG. 3b). During the plugging process, the lower end of the locking protrusion 222 will be scratched by the edge of opening 2151, so that the locking protrusion 222 can be plugged into the locking hole 215. Furthermore, a bonding agent (not shown) may be applied into the locking hole 215, to bond and fix the locking protrusion 222 in the locking hole 215. The locking protrusion 222 may be ground bump or dummy bump with thermal conducting function. Preferably, the height of the locking protrusion 222 is larger than that of the bumps 223. The bumps 223 are high temperature bumps (high lead bumps, such as lead/tin 95/5 or lead/tin 90/10), or metal materials with melting point of higher than 200° C. (higher than that of the solders 230), and they may be the bumps that cannot be reflowed, such as copper, nickel, gold.

The solders 230 are eutectic solders for connecting the leads 212 with the bumps 223 after reflowing. As shown in FIG. 3b, the flip chip 220 is flip-chip bonded to the leadframe 210 with the active surface 221 facing the upper surface 213 of the fastening part 211. When the bumps 223 of the flip chip 220 are bonded to the upper surface 216 of the leads 212 of the leadframe 210 through the solders 230, the locking protrusion 222 of the flip chip 220 is correspondingly plugged into the locking hole 215 to act as an anti-floating structure for the flip chip package 200, so as to fix the gap between the flip chip 220 and the leadframe 210 in the perpendicular direction, thus preventing the flip chip 220 from floating up during reflowing. Furthermore, when the bumps 223 and the leads 212 are soldered and bonded by the solders 230, the locking protrusion 222 is plugged into the locking hole 215; thus, due to a fixed gap, no necking portion will be formed in the solders 230. As shown in FIG. 4, the molding compound 240 seals the bumps 223 and the locking protrusion 222. In this embodiment, the lower surface 214 of the fastening part 211 and the lower surface 217 of the leads 212 are exposed outside the molding compound 240, so as to form a flip chip package without pins.

Since the locking protrusion 222 of the flip chip 220 is plugged into the locking hole 215 of the fastening part 213 to fix the gap between the flip chip 220 and the leadframe 210, the flip chip 220 is prevented from floating up or sliding aside when the solders 230 are reflowed, and the bumps 223 of the flip chip 220 will keep contact with the leads 212 of the leadframe 210, so as to avoid the solders 230 from generating necking at one side near the leadframe 210, thus enhancing reliability.

Figure 5:
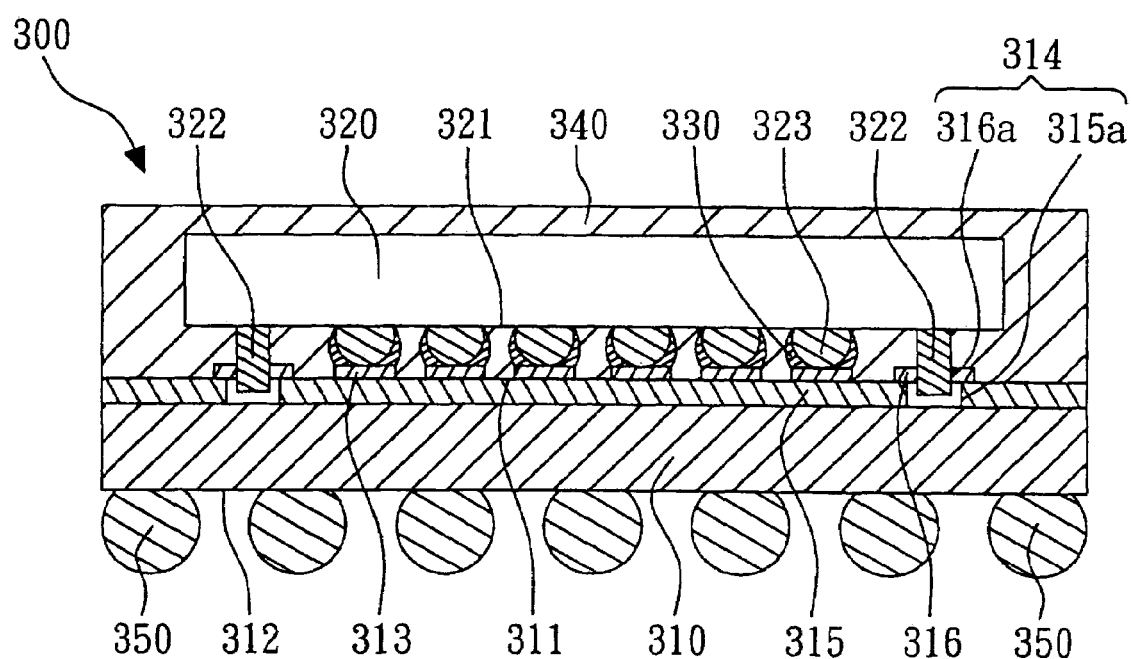
FIG. 5 is a schematic sectional view of a flip chip package with an anti-floating structure according to a second embodiment of the present invention.

Furthermore, the flip chip package provided by the present invention is used to solve the problem that the flip chip floats up when soldered to the chip carrier through the solders. In addition to the leadframe, other chip carriers may also be applied. Referring to FIG. 5, according to a second embodiment of the present invention, a flip chip package 300 with an anti-floating structure mainly comprises a chip carrier 310, a flip chip 320 with a plurality of locking protrusions 322, a plurality of solders 330, and a molding compound 340. The chip carrier 310 has an upper surface 311 and a lower surface 312. The chip carrier 310 further has a plurality of contacts 313 (such as connecting pads) exposed at the upper surface 311, and at least one locking hole 314 exposed at the upper surface 311. The chip carrier 310 may be selected from a group consisting of a printed circuit board, a ceramic circuit board, a leadframe, and a metal carrier. In this embodiment, since the chip carrier 310 is a circuit substrate, such as a printed circuit board or a ceramic circuit board, it may comprise a dielectric layer 315 and a copper layer 316. The dielectric layer 315 comprises at least one first hole 315a, whereas the copper layer 316 is formed on the dielectric layer 315 and comprises at least one second hole 316a aligned with the first hole 315a. The first hole 315a and the second hole 316a form the locking hole 314. Furthermore, the copper layer 316 and the contacts 313 may be made of the same copper foil. Preferably, the aperture of the second hole 316a of the copper layer 316 is smaller than that of the first hole 315a of the dielectric layer 315, thus providing the locking hole 314 with a notch, to facilitate plugging of the locking protrusion 322.

The flip chip 320 comprises an active surface 321 on which at least one of the locking protrusions 322 and a plurality of bumps 323 are formed. In this embodiment, the bumps 323 are arranged in a grid array, with the locking protrusion 322 disposed at the periphery or corner of the active surface 321. The bumps 323 are soldered to the contacts 313 by the reflowing of the solders 330, and the locking protrusion 322 is plugged into the locking hole 314. In addition, after flip-chip bonding, the molding compound 340 can be formed on the upper surface 311 of the chip carrier 310 by stamping or other techniques, to seal the bumps 323 and the locking protrusion 322. In this embodiment, the flip chip 320 is also sealed and wrapped by the molding compound 340. In addition, a plurality of solder balls 350 or other external conducting elements may be further disposed on the lower surface 312 of the chip carrier 310. By means of plugging the locking protrusion 322 into the locking hole 314, inappropriate floating up and disengagement of the flip chip 320 may be avoided during the reflowing process of the solders 330 and the formation process of the molding compound 340.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A flip chip package with an anti-floating structure, comprising:

a leadframe having a plurality of leads and a fastening part, the fastening part having at least one locking hole;

a flip chip having an active surface and at least one locking protrusion, the locking protrusion and a plurality of bumps being formed on the active surface, the locking protrusion being plugged into the locking hole of the fastening part, a height of the locking protrusion being larger than that of the bumps, the bumps keeping contact with the leads of the leadframe; and a plurality of solders for connecting the bumps to the leads.

2. The flip chip package according to claim 1, wherein the locking hole comprises an opening.

3. The flip chip package according to claim 2, wherein an outside diameter of the locking protrusion is slightly larger than a diameter of the opening of the locking hole.

4. The flip chip package according to claim 1, wherein the locking protrusion is used for grounding or thermal conducting.

5. The flip chip package according to claim 1, further comprising a molding compound for sealing the bumps and the rocking protrusion.

6. The flip chip package according to claim 5, wherein the fastening part comprises a lower surface exposed outside the molding compound.

7. The flip chip package according to claim 5, wherein each of the leads comprises a lower surface exposed outside the molding compound.

8. The flip chip package according to claim 1, further comprising a bonding agent applied into the locking hole, so as to fix the locking protrusion with the locking hole.

* * * * *